United States Patent [19]

Collins

[11] 4,164,712
[45] Aug. 14, 1979

[54] CONTINUOUS COUNTING SYSTEM
[75] Inventor: Johnny Collins, Oak Park, Ill.
[73] Assignee: Zenith Radio Corporation, Glenview, Ill.
[21] Appl. No.: 850,867
[22] Filed: Nov. 14, 1977
[51] Int. Cl.² ............................................ H03K 21/36
[52] U.S. Cl. ...................................... 328/48; 328/129
[58] Field of Search .................................. 328/48, 129

[56] References Cited
U.S. PATENT DOCUMENTS

| | | | |
|---|---|---|---|
| 2,832,044 | 4/1958 | Bliss | 328/129 X |
| 3,579,126 | 5/1971 | Paul | 328/129 |
| 3,757,233 | 9/1973 | Dixon | 328/48 X |
| 3,805,167 | 4/1974 | Nash et al. | 328/48 X |
| 4,036,431 | 7/1977 | Gidlof | 328/48 X |

Primary Examiner—John S. Heyman

[57] ABSTRACT

A continuous counting system includes a multistage binary counter for deriving the frequency of an input signal by counting the cycles thereof occurring during predetermined timing intervals. A control circuit, responsive to the input signal and to a timing reference signal, develops an output pulse during each period of the timing reference signal extending between a logical transition of predetermined polarity of the reference signal and the subsequently occurring nth logical transition of like polarity of the input signal. The output pulses are coupled for presetting the binary counter to the count n whereby counts beginning with n+1 are accumulated during the remainder of the timing interval.

7 Claims, 4 Drawing Figures

CONTINUOUS COUNTING SYSTEM

BACKGROUND OF THE INVENTION

The present invention relates to digital frequency counting systems. More particularly, the invention pertains to continuous counting systems useful for deriving the frequency of an input signal.

As used herein, the term continuous counting system refers to a system arranged for counting the cycles of an input signal occurring during each of a plurality of temporally adjacent timing intervals of predetermined duration for deriving the frequency of the input signal. In such a system, the count accumulated by the counter during each timing interval is related to the frequency of the input signal by the expression $f = N/d$, where f is the input signal frequency, N is the accumulated count and d is the time duration of the timing interval. By way of example, assuming an accumulated count of 664 during a 16.6 ms timing interval, it will be observed that the input signal is characterized by a frequency of 40 KHz.

In order to accumulate counts accurately representing the frequency of an input signal, continuous counting systems of the foregoing type conventionally include means for suitably resetting a binary counter at the initiation of each timing interval. In other words, the count accumulated during each timing interval must be independently derived and account for each cycle of the input signal occurring during the interval. For this purpose, clock circuits of various configuration are normally used to develop reset pulses for resetting the counter to state 0 at the beginning of each timing interval. Particularly in binary counters of the type which count by sensing logical transitions of the input signal, it is important that the reset pulses be relatively narrow compared to the period of the input signal in order that a pertinent logical transition not be inadvertently skipped. On the other hand, device responsiveness characteristics dictate that the reset pulses must be of some minimum width in order to confidently reset the counter. For relatively low speed logic families, such as CMOS and I$^2$L, reset pulses on the order of 0.5 microseconds are typically used whereas higher speed logic families such as TTL require reset pulses of only about 0.1 microseconds. Of course, the more narrow reset pulses provide increased confidence in the integrity of the accumulated count.

Prior art techniques for achieving narrow reset pulses commonly employ various types of circuits for differentiating a timing reference signal. Traditionally, analog RC circuits have been used for this purpose although recently digital differentiators have become popular. Typically, a digital differentiator comprises a string of series connected inverters coupling the timing reference signal to one input of a suitable logic gate, the other input of the gate being coupled directly to the source of the reference signal. The narrow reset pulses are obtained at the output of the gate and have pulse widths defined by the signal propagation delay time introduced by the series connected inverters.

In either case, i.e. analog or digital differentiators, component fabrication inconsistencies or variations result in a situation where it is quite difficult to repeatably provide differentiators which consistently develop output reset pulses of predictably narrow pulse width, thereby degrading counting accuracy. This lack of predictability, to a large extent, is caused by the tolerances associated with the resistive and the capacitive components in analog differentiators and by the extreme difficulty of precisely duplicating inverter characteristics in digital systems. The present invention seeks to overcome the foregoing problems by developing output pulses independently of differentiating circuits for suitably presetting the counter at the initiation of each counting interval.

SUMMARY OF THE INVENTION

It is an object of the present invention to provide an improved counting system.

Another object of the invention is to provide a novel circuit for initiating the timing intervals in a continuous counting system.

In accordance with the foregoing objects, a continuous counting system according to the present invention comprises a binary counter for accumulating a count representing the number of cycles of an input signal occurring during each of a plurality of timing intervals, a source of a periodically recurring timing reference signal, control means responsive to the reference and input signals for developing output pulses defined by a predetermined relationship between the input and reference signals and means coupling the output pulses for presetting the binary counter to a count depending upon the predetermined relationship. Counting is initiated during each timing interval from the preset count such that counts resulting from input signal cycles occurring during output pulse presetting intervals are accounted for in the accumulated count at the end of each timing interval.

DESCRIPTION OF THE PREFERRED EMBODIMENT

Figure 1:
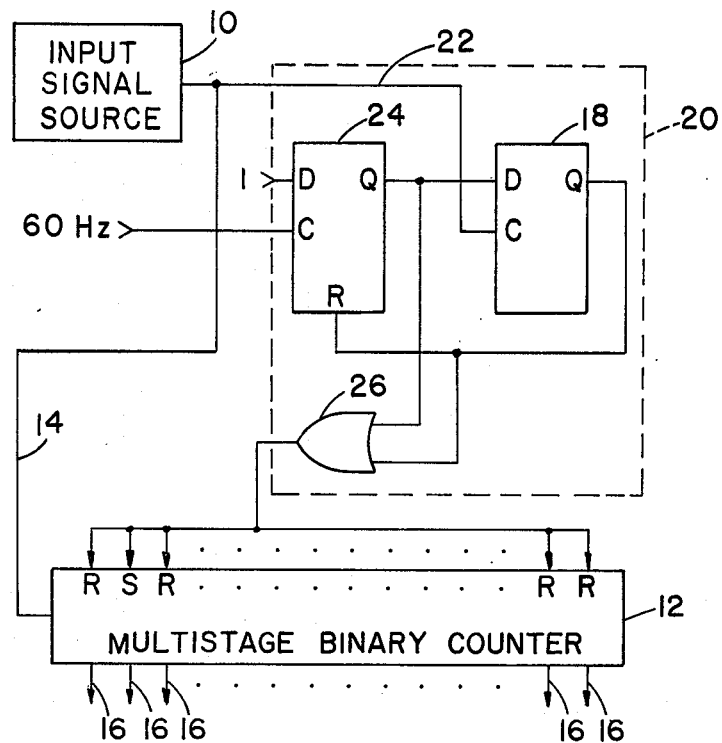
FIG. 1 is a block diagram illustrating one embodiment of the present invention.

Referring now to the drawings, FIG. 1 depicts a continuous counting system incorporating one embodiment of the present invention. An input signal whose frequency is to be derived by the counting system is coupled from an input signal source 10 to a multistage binary counter 12 over a line 14. Counter 12 may comprise, for example, a conventional Ripple counter or the like which accumulates a count representing the number of cycles of an input signal occurring during a predetermined timing interval by counting the logical 0 to 1 transitions of the input signal. The accumulated count is developed in binary format on a plurality of outputs 16, each output being indictive of the state of an associated stage of counter 12. The number of stages comprising counter 12 may vary depending upon the expected frequency of the input signal and the duration of the timing intervals. As a particular example, a system has been designed using a 10 stage binary counter in conjunction with 16.6 ms timing intervals for repetitively deriving the frequency of an input signal having an expected frequency in the range of 36 KHz to 44 KHz. In this system, accumulated counts ranging between about 608-735 identify the input signal frequency during each timing interval. Of course, depending upon the particular application of the counting system, the accumulated count developed on outputs 16 may be coupled via suitable decoding circuits to an appropriate utilization means.

The input signal developed by input signal source 10 is also coupled to the clock input of a D-type flip-flop 18 of a control means 20 by a line 22. Control means 20 further comprises a second D-type flip-flop 24 and an OR gate 26 having inputs connected to the Q outputs of flip-flops 18 and 24. The output of OR gate 26 comprises the output of control means 20 and, as will be explained in further detail below, is coupled in a particular sequence to the set and reset inputs of the individual stages of counter 12. With further reference to control means 20, the Q output of flip-flop 24 is connected to the D input of flip-flop 18, the Q output thereof being fed back to the reset input of flip-flop 24. Finally, the D input of flip-flop 24 is supplied from a source of a logical 1 signal level and its clock input is connected for receiving a 60 Hz timing reference signal. Flip-flops 18 and 24 are both positive edge triggered storage elements characterized in that data is transferred from the flip-flop's D input to its Q output in response to a logical 0 to 1 transition of the signal applied to its clock input.

Figure 3:
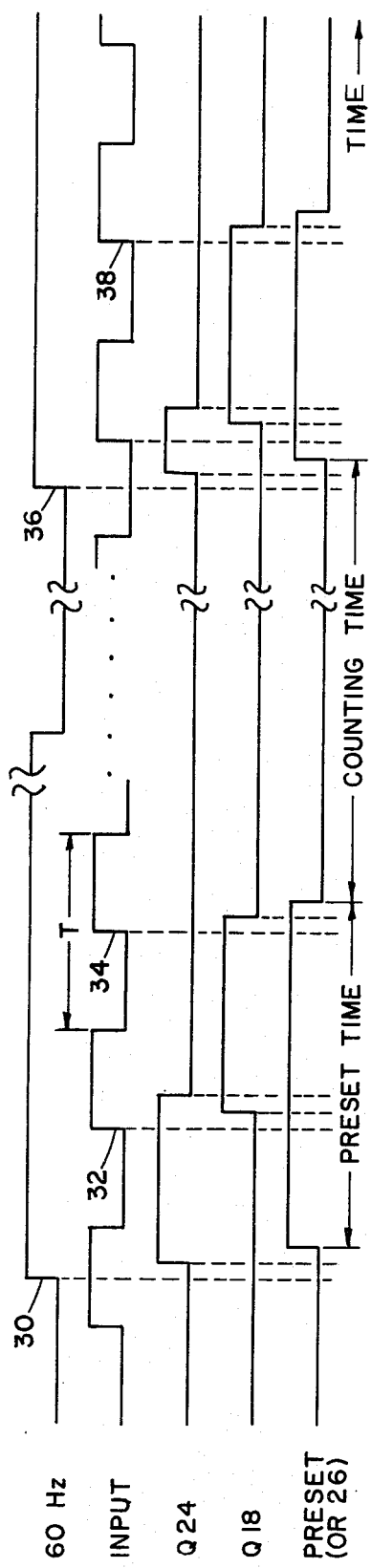
FIG. 3 depicts various waveforms pertinent to the operation of the system shown in FIG. 1.

Operation of the system illustrated in FIG. 1 is conveniently explained with reference to the waveforms illustrated in FIG. 3. Referring therefore to FIG. 3, the waveform illustrated in the top row represents the 60 Hz timing reference signal applied to the clock input of flip-flop 24 while the second row depicts the waveform of the input signal developed by input signal source 10. In this regard, it will be appreciated that the phase relationship between the 60 Hz timing reference signal and the input signal is uncontrolled and therefore entirely variable. The third and fourth rows show the Q outputs of flip-flops 24 and 18 respectively in response to the illustrated timing reference and input signals. The last row corresponds to the output of OR gate 26. The operating sequence of the system shown in FIG. 1 is initiated by a 0 to 1 transition 30 of the 60 Hz timing reference signal. This transition, after a short delay, results in a 1 level signal being transferred to the Q output of flip-flop 24. Next, the first subsequently occurring 0 to 1 transition 32 of the input signal causes the Q output of flip-flop 24 to be transferred to the Q output of flip-flop 18 after a short delay. Since, at the time of transition 32, the Q output of flip-flop 24 is 1, the Q output of flip-flop 18 also assumes a 1 level. The resulting 1 level at the Q output of flip-flop 18 is fed back to the reset input of flip-flop 24 whose Q output consequently goes to 0. The second 0 to 1 transition 34 of the input signal again causes flip-flop 18 to store the current value of the Q output of flip-flop 24. Since, at the time of transition 34, the Q output of flip-flop 24 is 0, the Q output of flip-flop 18 also goes to 0 after a short delay. Until the occurrence of the next 0 to 1 transition 36 of the 60 Hz timing reference signal (16.6 ms after transition 30), both Q outputs of flip-flops 18 and 24 remain at 0.

The Q outputs of flip-flops 18 and 24 are decoded by OR gate 26. Therefore, taking into account the small propagation delay time of the gate, the output of OR gate 26, referred to hereinafter as the preset pulse, maintains a logical 1 level from a time shortly following the Q output of flip-flop 24 going high in response to transition 30 until a time shortly following the Q output of flip-flop 18 going low in response to transition 34. Thus, the preset pulse has a width equal to the spacing between transition 30 of the 60 Hz timing reference signal and the second 0 to 1 transition 34 of the input signal. Moreover, the preset pulse temporally overlaps both 0 to 1 transitions 32 and 34 of the input signal. Accordingly, the 16.6 ms timing interval defined by the period of the 60 Hz timing reference signal is divided into a preset time interval during which counter 12 is set to a particular value and a counting time interval during which counter 12 is operative for counting the 0 to 1 transitions of the input signal. Also, since counter 12 does not count during the application thereto of the preset pulse, the output of OR gate 26 is connected for coupling the preset pulse for setting the counter to binary state 2. In this manner, the two 0 to 1 transitions 32 and 34 of the input signal occurring during the duration of the preset pulse are accounted for in the final count accumulated by counter 12 during the complete timing interval. Stated otherwise, the preset pulse, which is variable in width between one and two periods of the input signal depending upon its phase relationship with the 60 Hz timing reference signal, will always have a width such that counter 12 will be unresponsive only to the first two 0 to 1 transitions of the input signal. Consequently, the counting interval will necessarily ensue with the third 0 to 1 transition of the input signal. But, since counter 12 is preset by the preset pulse to state 2, accuracy of the final accumulated count is guaranteed.

The subsequently occurring 0 to 1 transition 36 of the 60 Hz timing reference signal defines the end of the current timing interval and the beginning of the next timing interval. It will be observed that although the phase relationship between transition 36 and the input signal is substantially different than in the preceeding timing interval, the preset pulse nevertheless extends slightly beyond the second occurring 0 to 1 transition 38 of the input signal. Counter 12 is again set during the duration of the preset pulse to binary state 2 and and thereafter counts the input signal beginning with the third 0 to 1 transition thereof. And, as previously explained, counting accuracy of the system is insured in that the pulse used to repetitively set counter 12 will always have a width corresponding to the count at which the system is initialized. Therefore, in the case of the system shown in FIG. 1, counter 12 is always preset to the count 2 and begins counting in response to the third 0 to 1 transition of the input signal. Most significantly, utilizing this technique of presetting the counter in a continuous counting system insures that no pertinent logical transitions of the input signal go unaccounted for in the final accumulated count.

Figure 2:
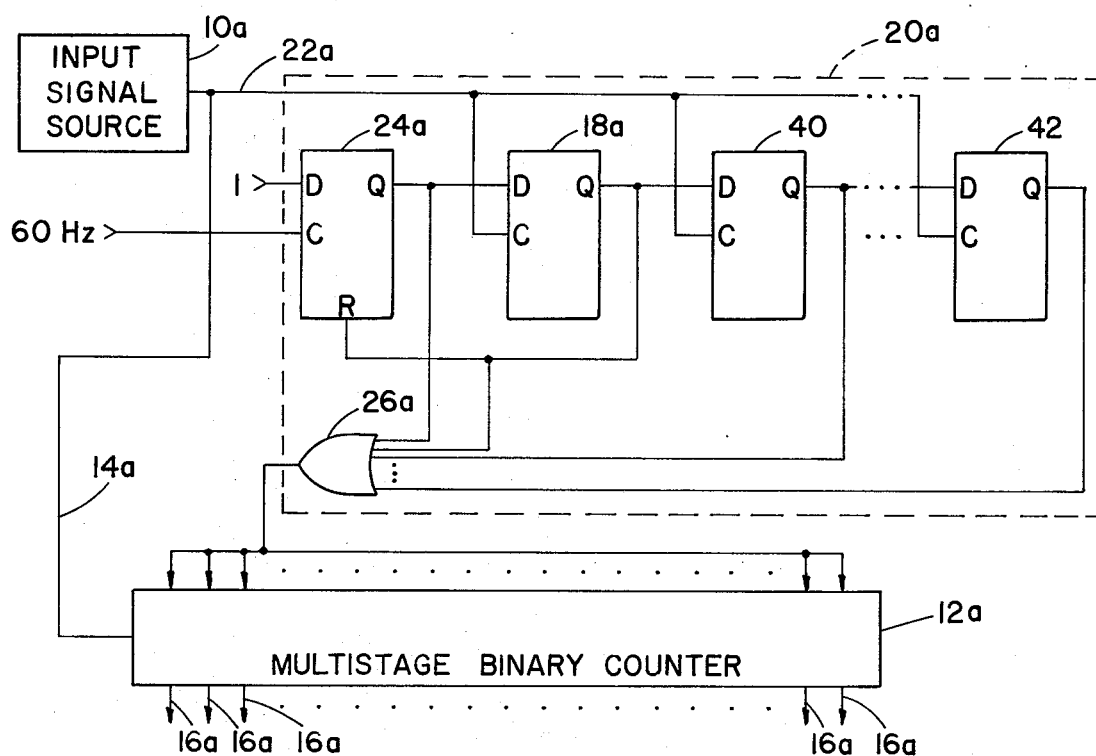
FIG. 2 is a block diagram illustrating a generalized extension of the system shown in FIG. 1 to n stages, where n is an arbitrary integer.

FIG. 2 illustrates a generalized extension of the system in FIG. 1 and is particularly useful where higher frequency input signals are encountered. In this regard, it will be recalled that the preset pulses developed at the output of OR gate 26 in the system of FIG. 1 have widths ranging between one and two periods of the input signal. Thus, assuming a 50 KHz input signal, preset pulses having widths between 20 and 40 microseconds would be expected. Also, as the input signal frequency increases, the pulsewidth of the preset pulse decreases proportionally. Therefore, a 100 KHz input signal would result in preset pulses having widths ranging between 10 and 20 microseconds. The circuit shown in FIG. 2 effectively provides means for stretching the widths of the preset pulses to ensure that the counter is consistently preset when higher frequency signals are being counted. This stretching effect is realizable to an arbitrary extent wherein the preset pulsewidth is confined to the range between $(n-1)T$ to $nT$, where T is the period of the input signal and n is a preselectable integer greater than or equal to 2.

Referring to FIG. 2, it will be observed that, to a large extent, the illustrated system is substantially similar to that shown in FIG. 1, the essential difference being the inclusion of additional flip-flop stages in control means 20a. Thus, a third D-type of flip-flop 40 is provided having its D input connected to the Q output of flip-flop 18a and its clock input coupled to input signal source 10a by line 22a. Additional flip-flops may be provided having inputs similarly connected, i.e. clock inputs connected to line 22a and D inputs connected to the Q output of the immediately preceeding stage, although, for purposes of clarity, only one such flip-flop 42 is specifically shown. In general, control means 20a may therefore comprise any number n of flip-flops depending upon the desired results. In any event, all of the Q outputs of the n flip-flops are coupled to multiple input OR gate 26a on whose output the preset pulse is developed. Finally, the preset pulse is coupled to the set and reset inputs of the individual stages of counter 12a for achieving a preset count of n. That is, if control means 20a comprises 3 flip-flops, counter 12a is preset to count 3. If, on the other hand, control means 20a comprises 4 flip-flops, counter 12a is preset to count 4 and so on.

Figure 4:
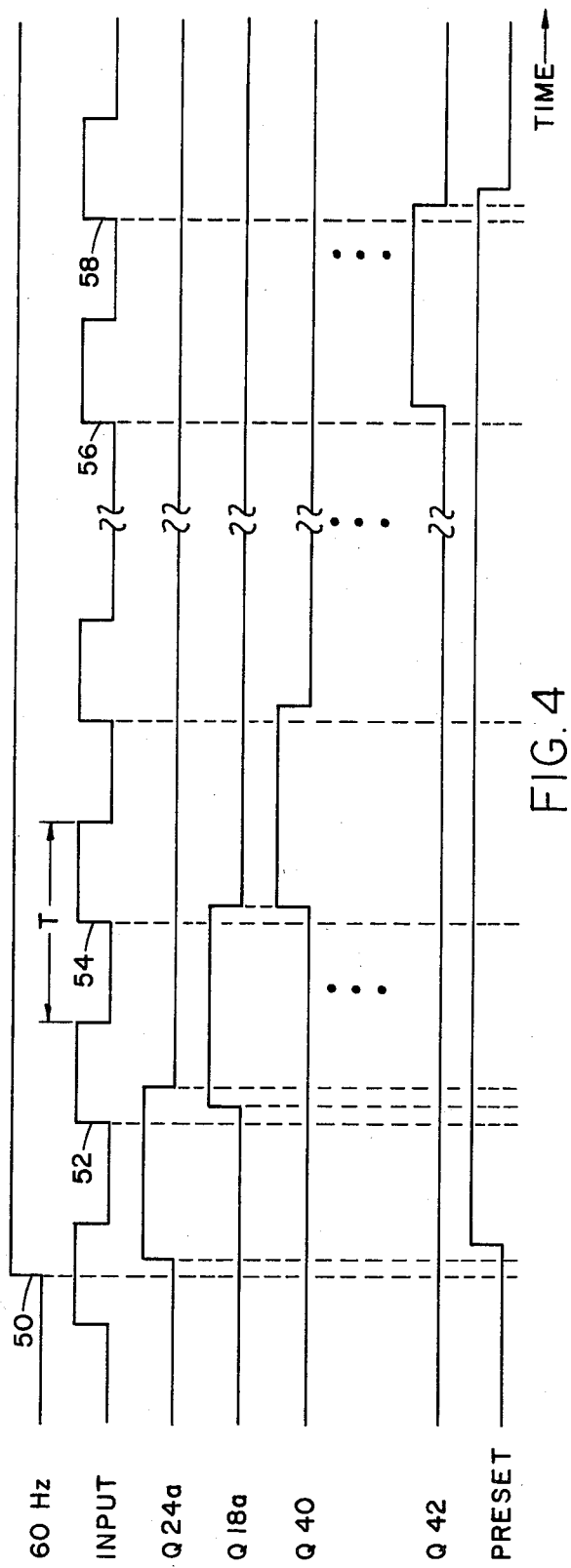
FIG. 4 depicts various waveforms pertinent to the operation of the system shown in FIG. 2.

The waveforms shown in FIG. 4 illustrates the operation of the system depicted in FIG. 2. Initially, a 0 to 1 transition 50 of the 60 Hz timing reference signal causes flip-flop 24a to transfer a 1 level signal to its Q output. The first subsequently occurring 0 to 1 transition 52 of the input signal causes flip-flop 18a to sample and store at its Q output the 1 level signal at the Q output of flip-flop 24a. The resulting 1 level signal at the Q output of flip-flop 18a is fed back to and resets flip-flop 24a. In response to the next 0 to 1 transition 54 of the input signal the 0 level signal at the Q output of flip-flop 24a is transferred to the Q output of flip-flop 18a and the 1 level signal at the Q output of flip-flop 18a is transferred to the Q output of flip-flop 40. The pulse produced at the Q outputs of flip-flops 24a, 18a and 40 is subsequently shifted through the remaining flip-flops comprising control means 20a in a similar manner in response to further 0 to 1 transitions of the input signal. Final flip-flop stage 42 develops a 1 level signal at its Q output in response to the $(n-1)$th 0 to 1 transition 56 of the input signal and returns to a 0 level in response to the nth 0 to 1 transition 58 of the input signal.

The output of multiple input OR gate 26a consequently comprises a 1 level signal extending from a time shortly following transition 50 of the timing reference signal to a time shortly following the nth transition 58 of the input signal. Also, since n 0 to 1 transitions of the input signal occur during the duration of the preset pulse, the output of OR gate 26a is connected for presetting counter 12a to count n at the beginning of each timing interval. Thus, as in the case of the FIG. 1 embodiment, counter 12a is preset to count n during the duration of the preset pulse and is operative thereafter for counting beginning with the $(n+1)$th 0 to 1 transition of the input signal. It will be appreciated that a similar sequence of operation is initiated upon each occurrence of a 0 to 1 transition of the timing reference signal whereby a plurality of adjacently occurring at timing intervals is produced.

While a particular embodiment of the present invention has been shown and described, it will be obvious to those skilled in the art that various changes and modifications may be made without departing from the invention in its broader aspects. For example, in lieu of decoding the Q outputs of the flip-flops comprising control means 20 or 20a by means of an OR gate, the $\overline{Q}$ outputs could be equivalently decoded through the use of a NAND gate. Also, it will be recognized that the D input of flip-flop 24 or 24a could alternatively be connected to the $\overline{Q}$ output of flip-flop 18 or 18a respectively instead of to a source of a logical 1 signal level. The aim in the appended claims is to cover all such changes and the modifications as may fall within the true spirit and scope of the invention.

What is claimed is:

1. In a continuous counting system of the type having a binary counter developing a count representing the number of cycles of an input signal occurring during each of a plurality of predetermined timing intervals, the improvement comprising:

a source of a periodically recurring timing reference signal;

control means responsive to said reference signal and to said input signal for developing during each period of said reference signal an output pulse defined by a predetermined relationship between said input and reference signals; and means coupling said output pulses for presetting said binary counter to a count dependent upon said predetermined relationship.

2. The improvement according to claim 1 wherein said control means comprises means for defining the pulsewidth of said output pulses according to said predetermined relationship.

3. The improvement according to claim 1 wherein said control means comprises means for developing said output pulses each characterized by transitions corresponding to a transition of predetermined polarity of said reference signal and to the subsequently occurring nth transition of said predetermined polarity of said input signal, where n is an integer.

4. The improvement according to claim 3 wherein said coupling means comprises means connected for presetting said counter to a count of n.

5. A continuous counting system comprising:

a signal source for developing an input signal;

a source of a periodically recurring timing reference signal;

counting means connected for counting the cycles of said input signal;

control means responsive to said input and reference signals for developing in response to each transition of a predetermined polarity of said reference signal an output pulse having a width corresponding to a count of n cycles of said input signal; and means coupling said output pulse for presetting said counter to a count of n.

6. A continuous counting system according to claim 5 wherein said control means comprises:

a first data storage circuit for developing an output defined by the duration between said transition of predetermined polarity of said reference signal and the first subsequently occurring transition of said predetermined polarity of said input signal;

a second data storage circuit for developing an output defined by the duration between said first subsequently occurring transition of said input signal and the next subsequently occurring transition of said predetermined polarity of said input signal; and gate means connected for developing an output signal comprising said output pulse for so long as either of said outputs of said storage circuits are present.

7. A continuous counting system according to claim 6 wherein said output pulses are coupled for presetting said counter to a count of 2.

* * * * *